(12) United States Patent
Kitano et al.

(10) Patent No.: US 6,465,876 B1
(45) Date of Patent: Oct. 15, 2002

(54) SEMICONDUCTOR DEVICE AND LEAD FRAME THEREFOR

(75) Inventors: Makoto Kitano, Tsuchiura; Akihiro Yaguchi, Ibaraki-ken; Naotaka Tanaka, Ibaraki-ken; Takeshi Terasaki, Ibaraki-ken; Ichiro Anjoh, Koganei; Ryo Haruta, Kodaira; Asao Nishimura, Kokubunji; Junichi Saeki, Yokohama, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 08/974,682

(22) Filed: Nov. 19, 1997

(30) Foreign Application Priority Data

Nov. 20, 1996 (JP) .............................. 8-309566

(51) Int. Cl.$^7$ .............................. H01L 23/02
(52) U.S. Cl. ...................... 257/668; 257/676
(58) Field of Search ................ 257/666, 669, 257/670, 684, 673, 676

(56) References Cited

U.S. PATENT DOCUMENTS 5,216,278 A  6/1993 Lin et al. ................. 257/668
5,440,169 A  8/1995 Tomita et al. ............. 257/667
5,448,105 A * 9/1995 Katoh et al. ............. 257/666
5,656,550 A * 8/1997 Tsuji et al. .............. 257/786
5,661,086 A * 8/1997 Nakashima et al. ........ 257/668

FOREIGN PATENT DOCUMENTS

| JP | 6-504408 | 5/1994 |
| JP | 6-224259 | 8/1994 |
| JP | 6-302604 | 10/1994 |
| JP | 8-88293 | 2/1996 |

* cited by examiner

*Primary Examiner*—Kenneth Parker
*Assistant Examiner*—Tai V. Duong
(74) *Attorney, Agent, or Firm*—Antonelli, Terry, Stout & Kraus, LLP

(57) ABSTRACT

A semiconductor device which can improve the connection reliability of solder bumps and productivity in manufacturing. Insulating tape having wiring patterns on its surface is bonded to a lead frame. Semiconductor elements are loaded and circuit formed surfaces and sides of the semiconductor elements are sealed with sealing resin. After arrangements of individual semiconductor devices are formed, the lead frame is separated into individual metal plates to form individual semiconductor devices. Such simultaneous production of a plurality of semiconductor devices enhances productivity, and improves flatness of the insulating tape, whereby the connection reliability of solder bumps is improved.

5 Claims, 9 Drawing Sheets

US 6,465,876 B1

SEMICONDUCTOR DEVICE AND LEAD FRAME THEREFOR

BACKGROUND OF THE INVENTION

The present invention relates to the structure of a semiconductor device, in which a tape-like insulating member provided thereon with a number of wiring patterns and a number of electrode pads is bonded on a metal plate, semiconductor elements are mounted on the metal plate, the wiring patterns are electrically connected to electrodes of the semiconductor devices, and solder bumps are connected as external terminals to the electrode pads; and, more particularly, to a semiconductor device which has excellent connection reliability for the external terminals and excellent productivity in manufacturing it.

Recently, while high integration of semiconductor devices and providing a number of pins on semiconductor devices have progressed, a technique has been put into practical use for significantly increasing the number of pins (number of terminals) by changing the arrangement of the external terminals of a semiconductor package from the conventional linear arrangement, using leads to a two-dimensional arrangement using metal bumps. One of the specific structures is disclosed in the U.S. Pat. No. 5,216,278, in which semiconductor elements are mounted on one side of a printed circuit board and metal bumps are arranged on the other side thereof. This structure is generally called a BGA (ball grid array).

In addition, a semiconductor device has been developed for which the semiconductor package is reduced in size to as close to the dimensions of semiconductor element as possible. Such a semiconductor device is called a CSP (chip size package or chip scale package). Conventional CSP technology is, as disclosed in Japanese Patent Application Laid-Open Publication No. 6-504408 (WO92/05582), to manufacture a semiconductor device in which insulating tape with wiring patterns and external terminals is mounted onto a circuit formed surface of a semiconductor element through a flexible material, thereby electrically connecting the wiring patterns to electrodes of a semiconductor element. In addition, Japanese Patent Application Laid-Open Publication No. 6-224259 discloses a structure in which semiconductor elements are mounted onto a ceramic substrate with through holes, electrodes are provided on the other side of the ceramic substrate, and the ceramic substrate is mounted onto a printed circuit board. Moreover, Japanese Patent Application Laid-Open Publication No. 6-302604 discloses a CSP of a structure in which metal wiring patterns are formed on the circuit formed surface of a semiconductor element, and the metal wiring patterns are provided with external terminals.

Still further, Japanese Patent Application Laid-Open Publication No. 8-88293 discloses a semiconductor device of a structure in which insulating tape with wiring patterns and solder bumps (external terminals) is placed around a semiconductor element, and the wiring patterns are electrically connected to electrodes of the semiconductor element.

Among the above prior arts, the semiconductor device described in Japanese Patent Application Laid-Open Publication No. 8-88293, that is, the semiconductor device with the insulating tape around the semiconductor element, is of a structure enabling it to simultaneously attain a reduction of the size and provision of multiple pins. Since this structure uses the insulating taper for wiring, the wiring pattern can be finer than a printed circuit board, so that the pitch between the solder bumps as the external terminals can be reduced, and the external dimensions of the package can be made small. In addition, since the solder bumps are provided outside the semiconductor element, a larger number of bumps can be provided regardless of the size of semiconductor element.

However, the semiconductor device with the conventional structure described above has the following points which it is desirable to improve.

The first point is the productivity. Since this structure uses insulating tape with low rigidity, it is necessary to bond a metal plate on the other side of the insulating tape in order to reinforce it. Unless the metal plate is bonded, the flatness of the tape cannot be maintained, and a step is formed at the tip of a solder bump, thereby significantly deteriorating connection reliability. If separate metal plates are prepared for each semiconductor element to assure the connection reliability and are bonded to the insulating tape, it significantly hinders the productivity.

The second point to be improved is the flatness of the insulating tape. When separate metal plates are prepared and bonded to the insulating tape, as described above, there is a possibility that the adhesive may not be maintained for uniform thickness, or warpage caused by the roll habit of the insulating tape may not be eliminated. If the insulating tape has poor flatness, dispersion may be generated in the height of the bumps, which are the external terminals, thereby degrading connection reliability.

SUMMARY OF THE INVENTION

The object of the present invention is to provide a semiconductor device which overcomes the above disadvantages, and can improve the connection reliability of external terminals and productivity in manufacturing.

To attain this object, the present invention provides a semiconductor device comprising a semiconductor element, an insulating tape on a surface on which a number of wiring patterns and a number of electrode pads are formed, and a metal plate bonded to a reverse surface of the insulating tape by an adhesive.

The wiring patterns are electrically connected to electrodes of the semiconductor element, a number of solder bumps are connected to the electrode pads, at least a circuit formed surface of the semiconductor element is coated with a sealing resin, wherein at least one side wall of the device is a cut surface, and cut surfaces of the insulating tape, adhesive, and the metal plate on the side wall are aligned with each other.

In the semiconductor device according to the present invention arranged as above, at least one side wall of the device is a cut surface and cut surfaces of the insulating tape, adhesive, and the metal plate are aligned with each other. Such a structure is formed by bonding the insulating tape on a lead frame acting as the metal plate, loading a number of semiconductor elements on the lead frame, electrically connecting the wiring patterns provided on the insulating tape to the electrodes of the semiconductor elements, sealing a circuit formed surface of each semiconductor element with sealing resin, and then cutting the lead frame to simultaneously form a metal plate corresponding to each of the semiconductor elements. That is, when the lead frame is ultimately cut and divided into individual semiconductor devices, either side wall becomes a cut surface, and cut surfaces of the insulating tape, adhesive, and the metal plate are aligned with each other, so that flaws generated from cutting become a continuous state. As described, since the individual semiconductor devices are divided after they are formed on the lead frame, a plurality of semiconductor devices can be simultaneously produced, thereby significantly improving the productivity. In addition, since there are only two types of plate members which are simple in shape, that is, a lead frame and an insulating tape are first bonded, bonding can be easily performed in various manners such as a press or roller as the case may be. Adhesive can be applied in a uniform thickness. In addition, even if there is any warpage caused by the roll habit of the insulating tape, it is easy to eliminate such warpage. Therefore, it becomes possible to improve the flatness of the insulating tape, whereby connection reliability can be enhanced for the solder bumps as the external terminals.

Furthermore, while potting resin has been frequently used as a sealing resin, it has low productivity and causes wide dispersion in its shape after sealing, which may cause insufficient reliability after 15 sealing. On the other hand, according to the present invention, since the semiconductor devices are not yet divided into individual pieces at the time of sealing with resin, it is possible to use the transfer mold process which is used for a conventional leaded package. This also enhances the productivity and the reliability of the sealing.

The metal plate of the semiconductor device as described above preferably comprises an element mount for mounting a semiconductor element, and an insulating tape mount positioned around the element mount and for mounting the insulating tape, wherein a top surface of the element mount is positioned at a lower position than a surface of the insulating tape mount and the element mount and the insulating tape mount are connected by connecting steps starting from outside of a boundary between the element mount and the insulating tape mount, and extending to an outer periphery of the element mount.

Since the top surface of the element mount is positioned at a lower position than the surface of the insulating tape mount, as described above, it becomes possible to prevent the semiconductor element from extending beyond the top surface of the insulating tape. It is necessary to secure the semiconductor while performing wire bonding, as will be described later. In this case, the semiconductor element is mounted on and secured to the element mount which is a part of the metal plate, and therefore, wire bonding can be stably and reliably carried out.

In the above, at least a part of an outer periphery of the metal plate may extend beyond an outer periphery of the insulating tape. In addition, in this case, projecting leads integral with the metal plate and projecting to the height of the solder bump may be provided on at least a part of the metal plate extending beyond the outer periphery of the insulating tape. Provision of such projecting leads enables the projecting leads integral with the metal plate to be connected to the ground of a printed circuit board upon mounting on the printed circuit board, whereby electrical noise generated in the semiconductor device can be reduced, and a semiconductor element with a higher operating frequency can be mounted. In addition, since a heat dissipation path is formed from the semiconductor element to the printed circuit board through the sealing resin, the metal plate, and the projecting leads, heat generated in the semiconductor element can be efficiently dissipated, thereby making it possible to reduce thermal resistance and to mount a semiconductor element with high heat generation.

When the tape automated bonding which is used in the tape carrier package is used in connecting the wiring pattern and the electrodes of the semiconductor element, a special manufacturing apparatus is required, and it is necessary to prepare the tape for each semiconductor element because the wiring pattern has no degree of freedom regarding the electrodes of the semiconductor element. However, according to the present invention, since the other side of the insulating tape has been bonded with the lead frame with high rigidity, when the electrodes of the semiconductor element are connected to the wiring pattern, the wiring pattern is also made rigid, so that they can be connected by a wire bonding process with higher connection reliability. That is, according to the present invention, it is preferable to use a metal wire for the electrical connection of the wiring pattern and the electrodes of the semiconductor element with the wire bonding process.

However, if wire bonding is not employed, the electrical connection between the wiring pattern and the electrodes of the semiconductor element may be performed by using the tape automated bonding.

In addition, it is also preferable that the insulating tape for connection to the lead frame is one continuous tape, common to each of the semiconductor elements. This eliminates the necessity to prepare an insulating tape for each semiconductor element, and also to individually bond the insulating tape, so that the productivity is further enhanced.

In addition, the present invention provides a lead frame for a semiconductor device which comprises a plurality of semiconductor loading sections for loading a plurality of semiconductor elements, and a plurality of devices being constituted by loading each of the semiconductor elements in the semiconductor loading section, wherein a plurality of insulating tape provided with a number of wiring patterns and a number of electrode pads at positions corresponding to each of the semiconductor element loading sections are bonded through adhesive provided on the opposite surface to the surface with the wiring patterns.

Alternately, instead of bonding a plurality of insulating tapes on the lead frame as described above, insulating tape may be one continuous tape, common to each of the semiconductor elements, provided with a number of wiring patterns and a number of electrode pads at positions corresponding to each of the semiconductor element loading sections, and bonded through adhesive provided on the opposite surface to the surface with the wiring patterns.

PREFERRED EMBODIMENTS OF THE INVENTION

The first embodiment of the present invention is described with reference to FIGS. 1 through 5.

Figure 1:
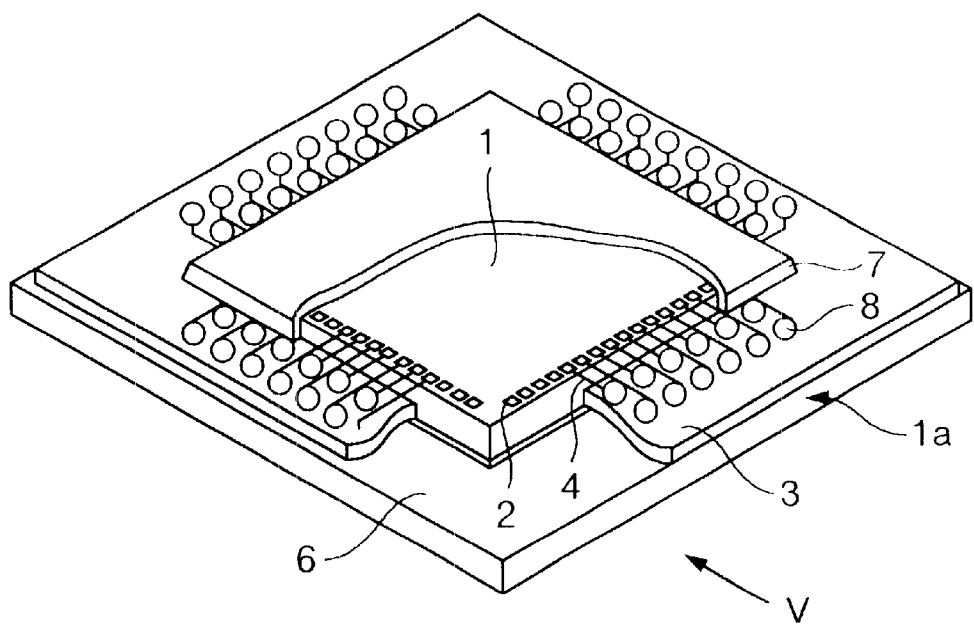
FIG. 1 is a perspective view of a first embodiment of a semiconductor device according to the present invention.
Figure 2:
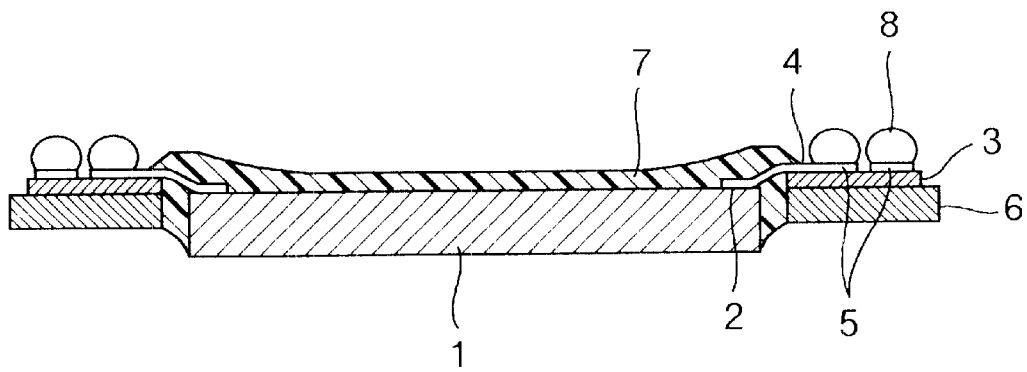
FIG. 2 is a sectional view at the center of the semiconductor device shown in FIG. 1.

FIG. 1 is a perspective view of the first embodiment of a semiconductor device according to the present invention, and FIG. 2 is a sectional view, sectioned at its center. As shown in FIGS. 1 and 2, a semiconductor element 1 is loaded into a hole at the center of a metal plate 6, and an insulating tape (insulating material in a tape form) 3 with wiring patterns 4 and pads 5 is bonded on the surface of the metal plate 6 round the semiconductor element. The material for the wiring pattern 4 may be, for example, copper foil. One (inner one) of the wiring patterns 4 projects from the inner periphery of the insulating tape 3, and is electrically connected to an electrode 2 of the semiconductor element 1 by a tape automated bonding process. The other one connects to the pad 5 for connecting a solder bump 8. The metal plate 6 serves to reinforce the insulating tape 3, provided with the wiring patterns 4 and the pads 5. The outer periphery of the metal plate 6 projects outward from the outer periphery of the insulating tape 3. In addition, a circuit formed surface and sides of the semiconductor element 1 are sealed by sealing resin 7. However, in FIG. 1, a part of the sealing resin is omitted for the purpose of clearly representing the structure.

Moreover, a side wall 1a of the semiconductor element 1 is a cut plane. Cut planes of the insulating tape 3, adhesive 20, and metal plate 6 on the side wall 1a align with each other, so that flaws 30 caused from cutting continuously occur (see FIG. 5).

Figure 3:
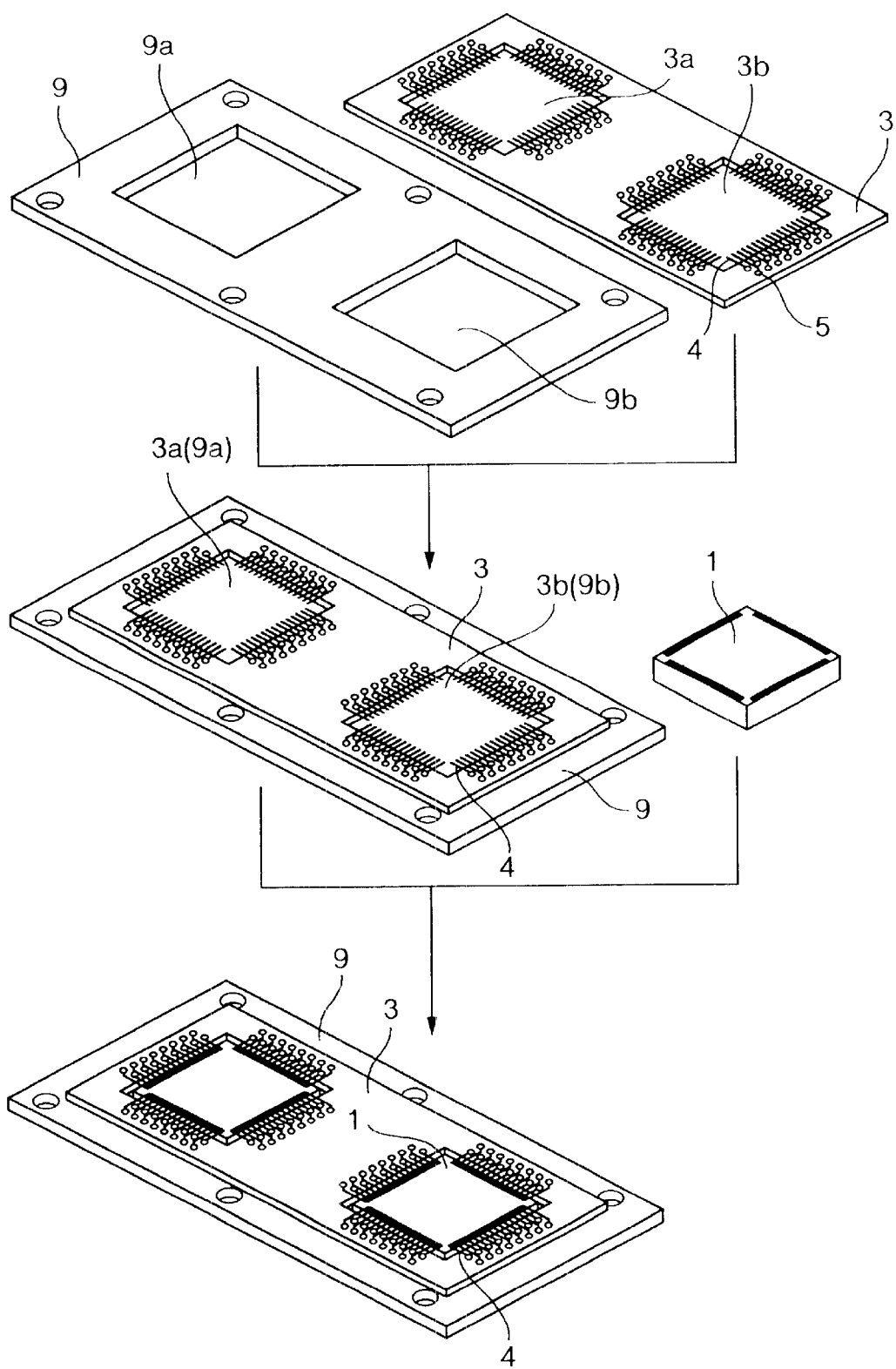
FIG. 3 is a view showing a manufacturing process for the semiconductor device shown in FIGS. 1 and 2.

A manufacturing process of the first embodiment, shown in FIGS. 1 and 2, is described with reference to FIGS. 3 and 4. First, as shown in FIG. 3, a lead frame 9 is provided with a plurality of holes 9a and 9b (two holes in FIG. 3) for housing the semiconductor elements 1, and the insulating tape 3 is provided with a plurality of holes 3a and 3b for housing a plurality of semiconductor elements. The wiring patterns 4 and the pads 5 are bonded to the lead frame 9. The insulating tape 3 is continuous tape, common to each of a plurality of semiconductor elements to be loaded. Since the bonding process is only for the purpose of bonding two types of plate members with simple geometry, that is, the lead frame 9 and the insulating tape 3, bonding can be easily performed in various manners, such as a press or roller as the case may be. The adhesive 20 can be applied in a uniform thickness. In addition, even if there is any warpage caused by the roll habit of the insulating tape, it is easy to eliminate such warpage.

Then, the semiconductor elements 1 are loaded into the holes 9a and 9b. In this case, since the inner end of 10 the wiring pattern 4 projects from the inner periphery of the holes 9a and 9b and the holes 3a and 3b, it is arranged for the semiconductor element 1 to be housed in the holes from the bottom of the lead frame 9, so that the inner end of the wiring pattern 4 is not damaged. Then, the wiring pattern 4 is electrically connected to the electrodes 2 of the semiconductor element 1. In this case, the embodiment employs the tape automated bonding process.

Figure 4:
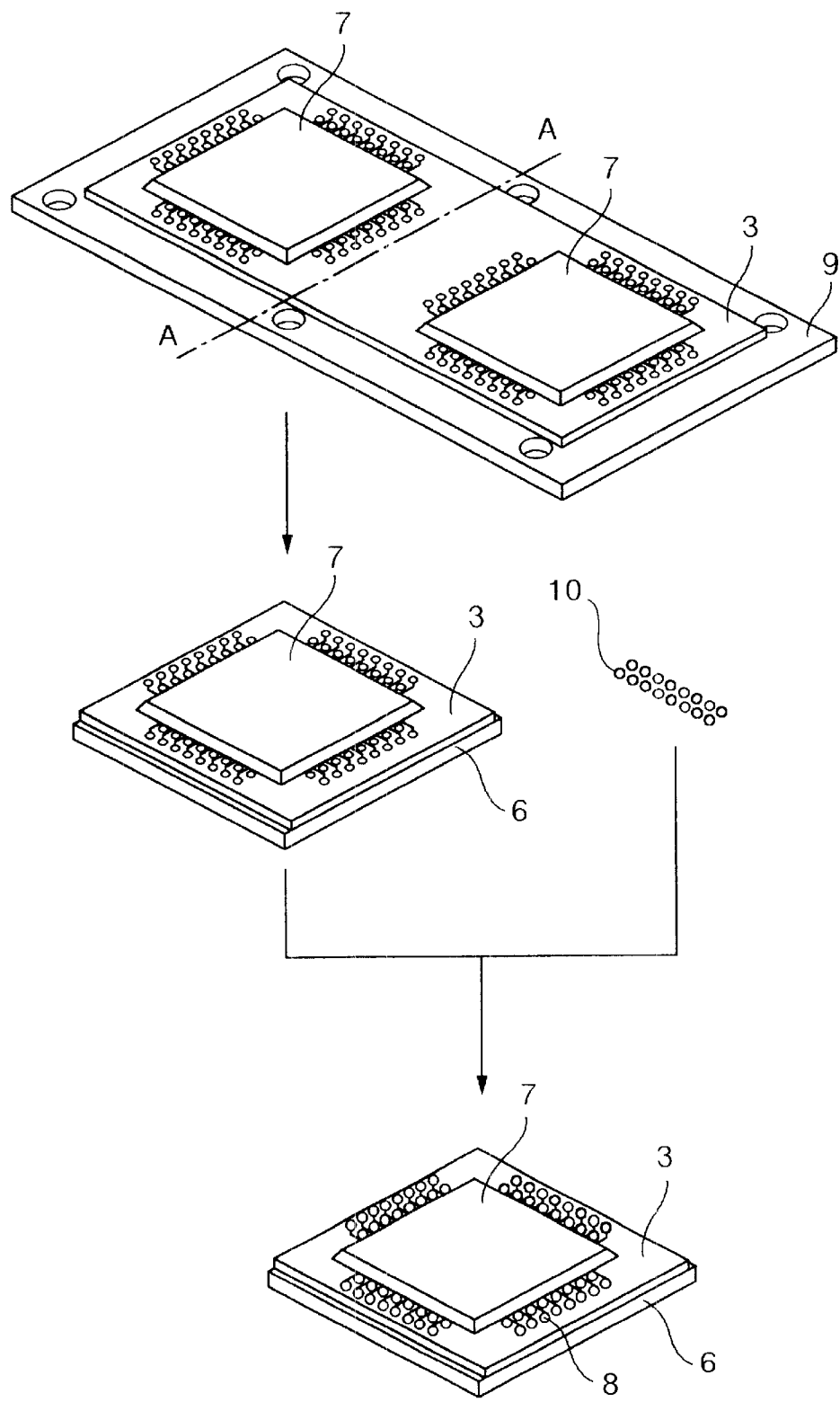
FIG. 4 is a view showing a manufacturing process for the semiconductor device shown in FIGS. 1 and 2, and continued from FIG. 3.

Then, as shown in FIG. 4, the circuit formed surface and sides of the semiconductor element 1 and sealed with sealing resin 7. A potting process used for a conventional tape carrier package is employed for sealing. Then, the lead frame 9 and the insulating tape 3 are cut and separated along a dot-and-dash line A—A, shown in FIG. 4, into individual semiconductor devices, whereby the metal plate 6 corresponding to each semiconductor element is formed. Finally, solder balls 10 are connected to the pads 5 provided on the insulating tape 3 to form solder bumps 8. When the semiconductor device is manufactured by the above process, and the lead frame 9 is finally cut and separated into individual semiconductor devices, its cut plane constitutes the side wall 1a, as described above.

Figure 5:
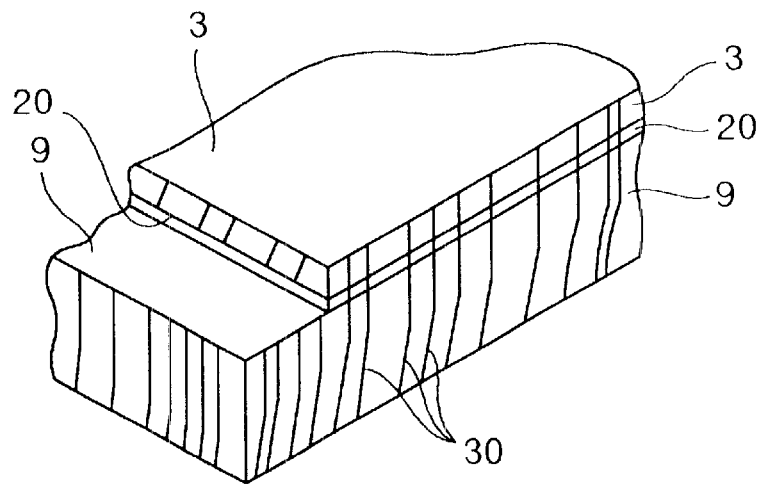
FIG. 5 is a partial perspective view viewed from the direction V in FIG. 1.

Then, cut planes of the insulating tape 3, adhesive 20, and metal plate 6 on the side wall 1a align with each other, so that flaw 30, caused from cutting is in a continuous state as shown in FIG. 5.

According to the embodiment described above, the arrangements of semiconductor devices are formed on the lead frame 9 with the insulating tape 3, the semiconductor elements 1, the sealing resin 7, and the like, and thereafter the arrangements are cut and separated. Therefore, a plurality of semiconductor devices can be simultaneously manufactured, so that the productivity can be significantly enhanced. In addition, since the insulating tape 3 is one continuous tape, common to each of a plurality of semiconductor elements 1 to be loaded, it is not necessary to prepare separate insulation tapes for each semiconductor element 1, and it is also not necessary to separately bond the insulating tapes, so that the productivity is further enhanced.

In addition, since only two types of plate members with simple geometry, that is, the lead frame 9 and the insulating tape 3, are first bonded, bonding can be easily performed in various manners. The adhesive 20 can be applied in a uniform thickness. In addition, even if there is any warpage caused by the roll habit of the insulating tape 3, it is easy to eliminate such warpage. Therefore, it becomes possible to improve the flatness of the insulating tape 3, whereby connection reliability of the solder bumps 8 as the external terminals can be enhanced.

Furthermore, since the semiconductor devices are not separated into individual devices at the time of sealing with the sealing resin 7, it is possible to employ the transfer mold process used for the conventional leaded package, instead of potting resin. This also enhances the 10 productivity and the reliability of sealing.

Now, second and third embodiments of the present invention will be described with reference to FIGS. 6 and 7, respectively. Here, in FIGS. 6 and 7, the same reference numerals denote the same components as those in the first embodiment in FIGS. 1–5.

Figure 6:
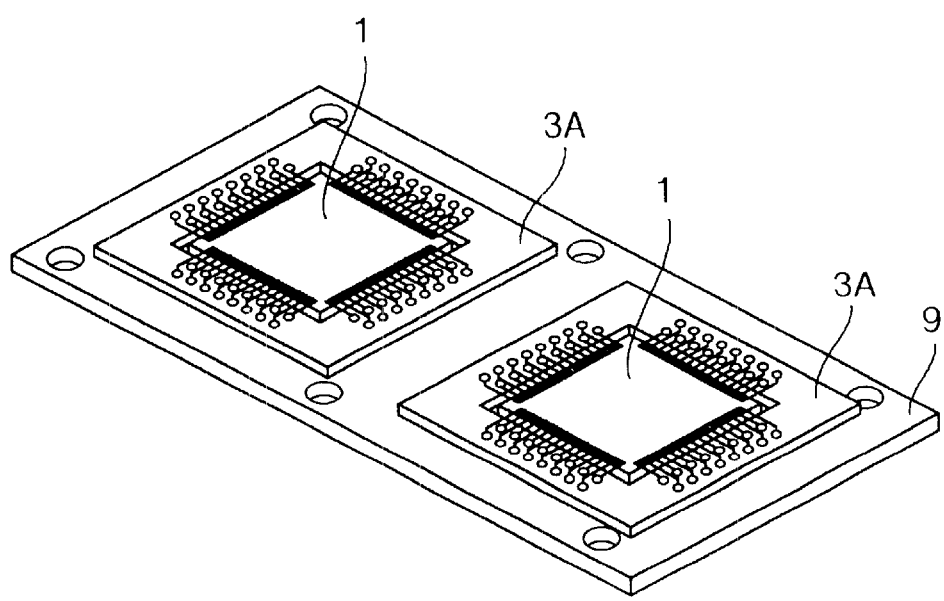
FIG. 6 is a perspective view of a second embodiment of a semiconductor device according to the present invention, and shows the state before the circuit formed surface and side surface of a semiconductor element is sealed with sealing resin.
Figure 7:
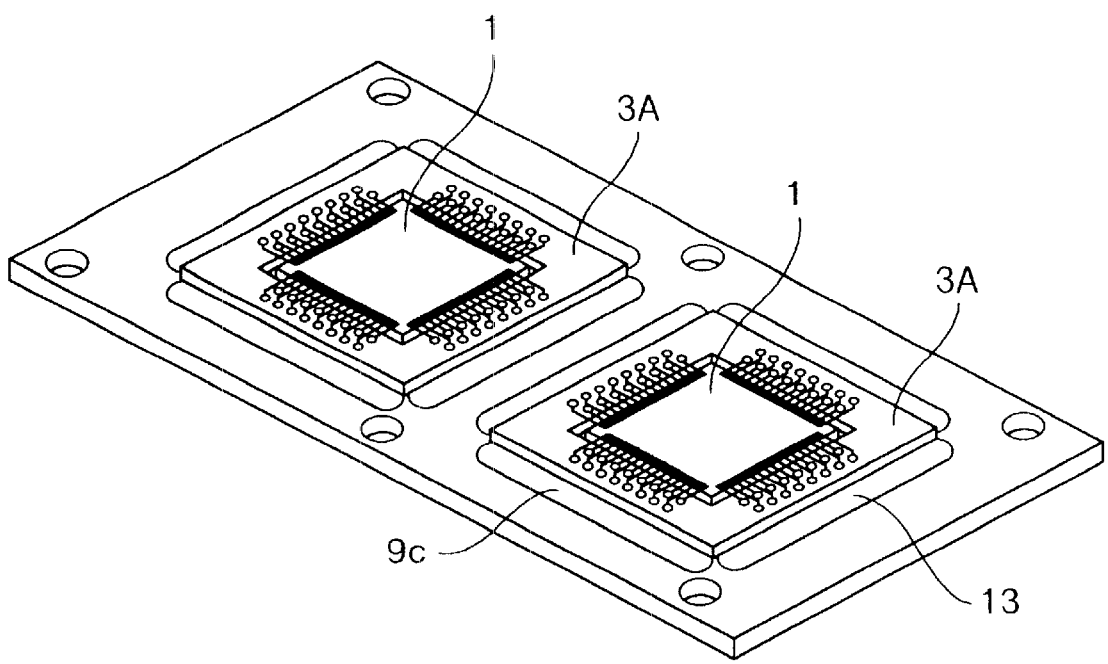
FIG. 7 is a perspective view of a third embodiment of a semiconductor device according to the present invention, and shows the state before the circuit formed surface and side surface of a semiconductor element are sealed with sealing resin.

Both FIGS. 6 and 7 show the state before the circuit formed surface and side surface of the semiconductor element 1 are sealed with the sealing resin 7. The insulating tape for the embodiments of FIGS. 6 and 7 is not one continuous tape common to each of the semiconductor elements 1, as is the insulating tape 3 of FIG. 3, but is separate insulating tape 3A for each of the semiconductor elements 1. In addition, in the embodiment of FIG. 7, slits 13 are previously provided in a lead frame 9c for easy cutting in separation.

The structure and manufacturing process of the semiconductor device are the same as those for the first embodiment, except for those steps described above. Also in these embodiments, the arrangements of semiconductor devices are formed on the lead frame 9 or 9c with the insulating tapes 3A, the semiconductor elements 1, the sealing resin, and the like, and thereafter, they are cut and separated. However, since some spacing is provided between insulating tapes 3 A, only the lead frame 9 or 9c is cut during separation into individual semiconductor devices. Therefore, after the separation, the cut side surfaces of the insulating tape 3A and adhesive 20 and the cut surface of the metal plate do not align with each other on the side wall of the semiconductor device after separation, and flaws generated from cutting do not become a continuous state.

According to the second and third embodiments, although it is necessary to prepare and bond separate 15 insulating tapes for each of the semiconductor elements 1, they provide the same advantages as in the first embodiment in all other aspects.

Now, a fourth embodiment of the present invention will be described with reference to FIGS. 8 through 10. However, the same reference numerals denote the same components as those in the embodiments shown in FIGS. 1–7.

Figure 8:
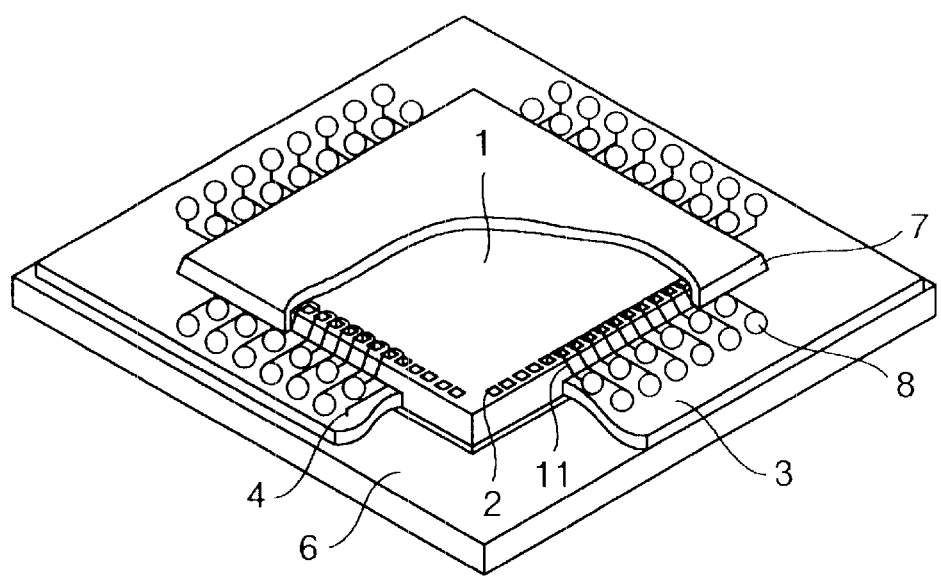
FIG. 8 is a perspective view of a fourth embodiment of a semiconductor device according to the present invention.
Figure 9:
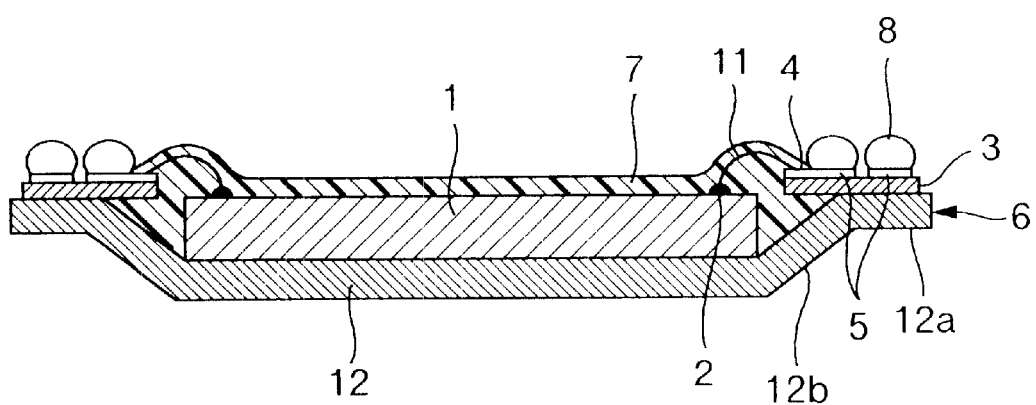
FIG. 9 is a sectional view at the center of the semiconductor device shown in FIG. 8.
Figure 10:
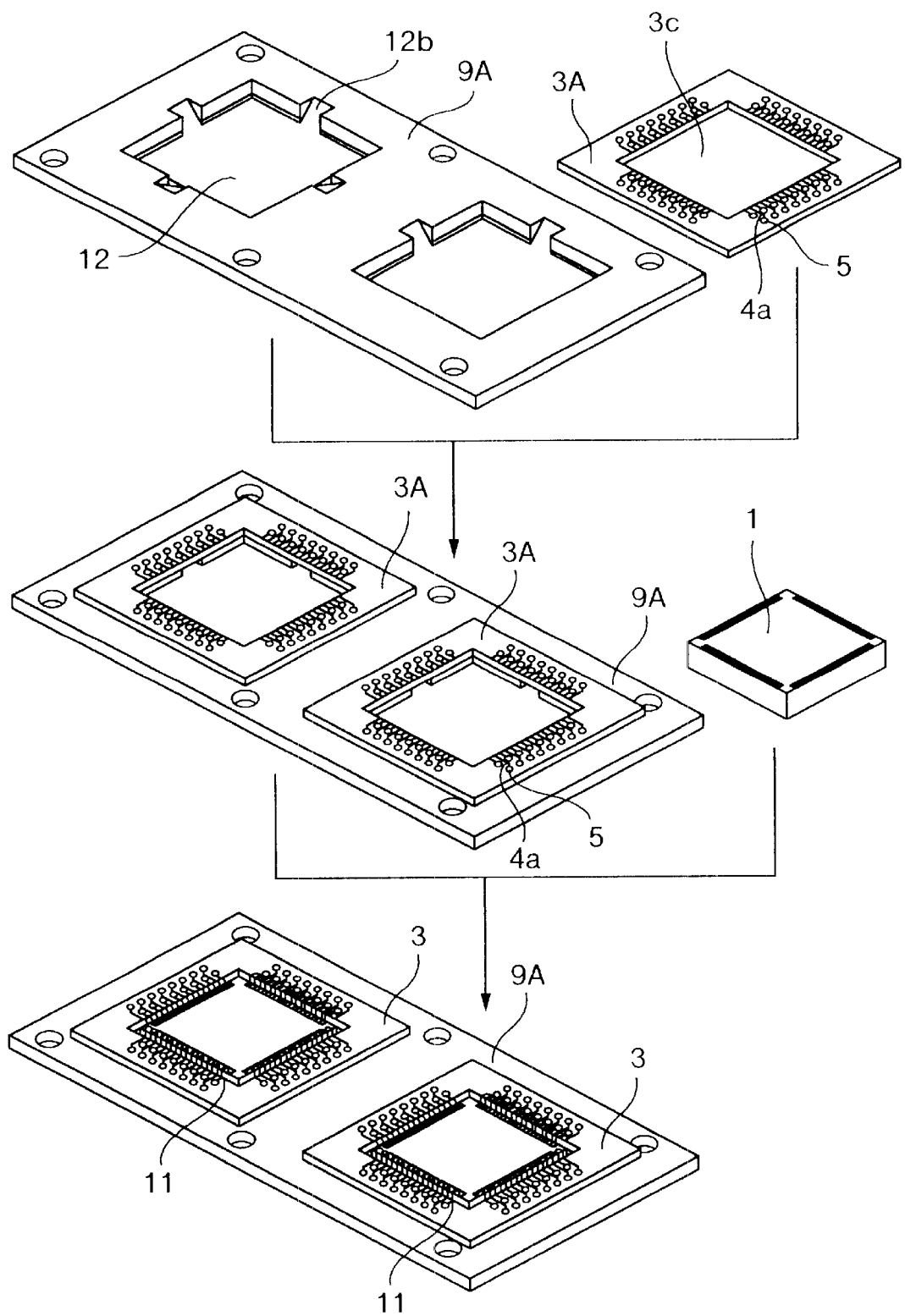
FIG. 10 is a view showing a manufacturing process for the semiconductor device shown in FIGS. 8 and 9.

FIG. 8 is a perspective view of the fourth embodiment, and FIG. 9 is a sectional view, sectioned at the center thereof. As shown in FIGS. 8 and 9, the metal plate 6 does hot have a hole extending therethrough, and an element mount 12 integral with the metal plate 6 is provided at its center. Then, a region outside the element mount 12 of the metal plate 6 constitutes an insulating tape mount 12a. In addition, the top surface of the element mount 12 is lower than the surface of the insulating tape mount 12a. A connecting step 12b connects between the element mount 12 and the insulating tape mount 12a. In addition, an inner region of the wiring pattern 4 is connected to the electrodes of the semiconductor element 1 with wires 11 (using the wire bonding process). The arrangement other than the above is the same as in the second embodiment. However, in FIG. 8 a 10 part of sealing resin is removed for clearly representing the structure.

A manufacturing process of the semiconductor device of the embodiment shown in FIGS. 8 and 9 is described with reference to FIG. 10. First, the insulating tape 3A provided with hole 3c for housing a semiconductor element, the wiring patterns 4a, and the pads 5a, is bonded to a lead frame 9A provided with a plurality of element mounts 12 (two in FIG. 3) for mounting the semiconductor element. However, the insulating tape 3A is a separate tape for each semiconductor element 1, as are those of the embodiments shown in FIGS. 6 and 7. In addition, the wiring pattern 4a exists only within the surface of the insulating tape 3A, and the inner region of the wiring pattern 4a is arranged so as not to project into the hole 3c of the insulating tape 3A. The connection step 12b starts from outside of the boundary between the element mount 12 and the insulating tape mount 12a, and extends to the outer periphery of the element mount 12. This allows shortening the distance between the outer periphery of the element mount 12 and the inner periphery of the insulating tape mount 12a to be as short as possible.

Then, the semiconductor elements 1 are mounted on the element mount 12 from above the lead frame 9A, and bonded thereto. At the moment, since the inner region of the wiring pattern 4a is arranged so as not to project into the hole 3c of the insulating tape 3A, the wiring pattern 4a is not damaged, even if the semiconductor element 1 is mounted from above the lead frame 9A, and handling is also easy. In addition, since the top surface of the element mount 12 is lower than the surface of the insulating tape mount 12a, it becomes possible to prevent the semiconductor element 1 from projecting from the top surface of the insulating tape 3A. Then, the wiring pattern 4 a is electrically connected to the electrodes of the semiconductor element 1 by wires 11. The process thereafter is the same as shown in FIG. 4.

In the above, while the wire bonding process is employed, because of the unique structure of the embodiment, it is possible that the bonding of the lead frame 9A and the insulating tape 3A can be first carried out. The wire bonding process connects metals to each other by using both thermal press bonding and ultrasonic welding. To attain such an operation, it is necessary that the wiring pattern to be connected has high rigidity. If it is low, the connecting surface may be depressed, and, as a result press bonding force may not be transmitted, or an ultrasonic wave may be absorbed so that welding cannot be performed. According to the present invention, the other side of the insulating tape 3A has been bonded with the lead frame 9A with high rigidity when the electrodes 2 of the semiconductor element 1 are connected to the wiring pattern 4a, and therefore, the wiring pattern 4a is also made rigid, so that they can be connected with a wire bonding process with higher connection reliability. In addition, since the semiconductor element 1 is firmly secured on the element mount 12, further secure and reliable connection can be attained.

When the tape automated bonding which has been used in the tape carrier package is used, a special manufacturing apparatus is required, and it is necessary to prepare tapes for each semiconductor element because the wiring pattern has no degree of freedom with regard to the electrodes of the semiconductor element. However, the present invention is advantageous in that connection can be carried out by the wire bonding process with higher connection reliability.

According to the embodiment described above, since the lead frame 9A with high rigidity is bonded on the other side of the insulating tape 3A, it is possible to enhance the rigidity of the wiring pattern 4a, and to attain stable connection with the wire bonding process with higher connection reliability. Moreover, since the semiconductor element 1 is firmly secured on the element mount 12, further secure and reliable connection can be attained.

In addition, since the top surface of the element mount 12 is lower than the surface of the insulating tape mount 12a, it is possible to prevent the semiconductor element 1 from projecting from the top surface of the insulating tape 3A.

Furthermore, since the connecting step 12b is provided with the above-mentioned shape, this allows it to shorten the distance between the outer periphery of the 10 element mount 12 and the inner periphery of the insulating tape mount 12a to be as short as possible.

Now, the fifth embodiment of the present invention is described with reference to FIGS. 11 and 12. The same reference numerals are used to denote the same components 15 as those in the above described embodiments, shown in FIGS. 1–7.

Figure 11:
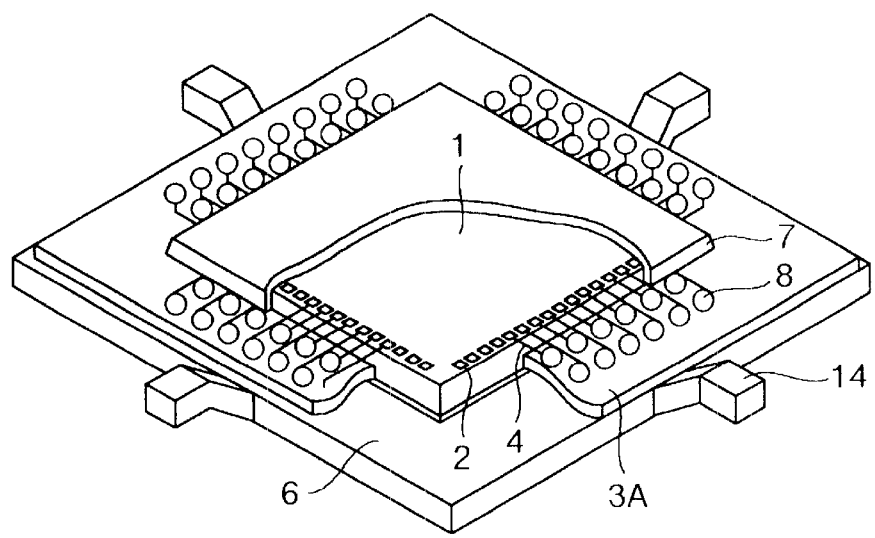
FIG. 11 a perspective view of a fifth embodiment of a semiconductor device according to the present invention.
Figure 12:
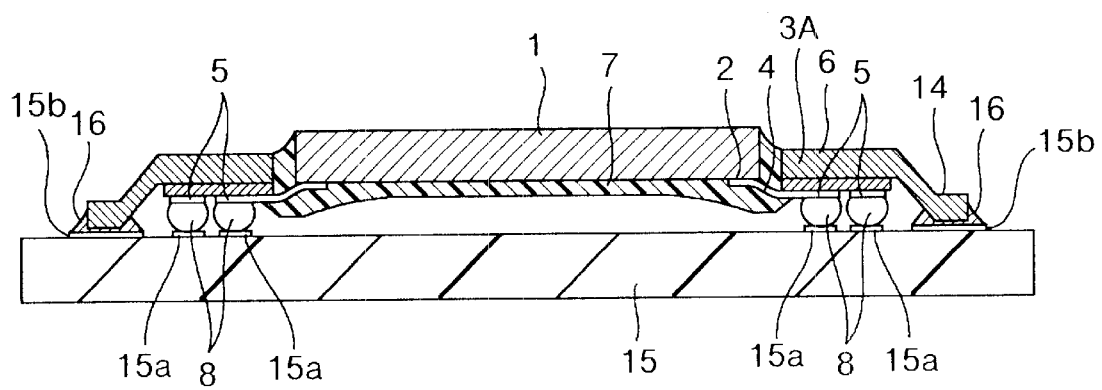
FIG. 12 is a sectional view at the center which illustrates when the semiconductor device of FIG. 11 is mounted onto a printed circuit board.

FIG. 11 is a perspective view of the fifth embodiment, and FIG. 12 is a sectional view at the center of the semiconductor device of FIG. 11 when it is mounted on a printed circuit board. As shown in FIGS. 11 and 12, in the fifth embodiment, projecting leads 14 projecting upward from the surface of metal plate 6 are provided on the outer periphery of the metal plate 6. The projecting leads 14 project to the plane containing the top surface of the solder bump 8, that is, to the full height of the solder bump 8. The arrangement other than the above is the same as in the second embodiment.

When this semiconductor device is mounted on a printed circuit board, the solder bumps 8 are welded to the electrodes 15a of the printed circuit board 15, as shown in FIG. 12, and the tips of the projecting leads 14 are welded to the projecting lead connecting sections 15a of 5 the printed circuit board 15 through the solder 16. Finally, the projecting lead connecting sections 15b are connected to the ground.

The semiconductor device with such an arrangement exhibits the following two advantages when mounted on the 10 printed circuit board.

First is the enhancement of electrical characteristics. Since the metal plate 6 is insulated and positioned very close to the wiring pattern 4, when the projecting leads 14 integral with the metal plate 6 are welded to the projecting lead connecting sections 15b connected to the ground, the projecting leads can be used as a ground plane, thereby making it possible to reduce the electrical noise generated in the semiconductor device, so that the semiconductor element I to be mounted may be one with a higher operating frequency.

The second is the reduction of thermal resistance from the semiconductor device to the printed circuit board. Since a heat dissipation path is formed from the semiconductor element 1 to the projecting lead connecting sections 15b on the printed circuit board 15 through the sealing resin 7, the metal plate 6, and the projecting leads 14, heat generated in the semiconductor element 1 can be efficiently dissipated, thereby making it possible to reduce thermal resistance and to mount a semiconductor element 1 with high heat generation.

Figure 13:
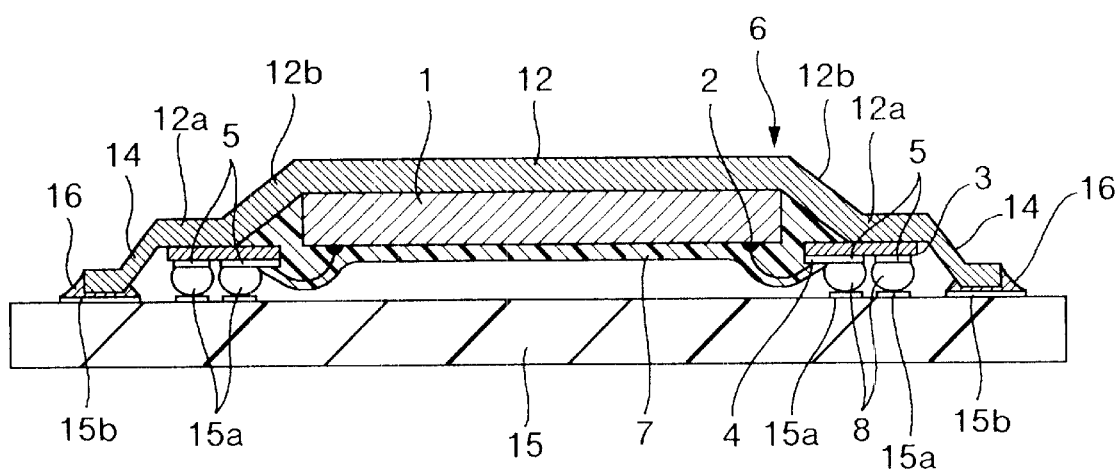
FIG. 13 is a sectional view at the center of a sixth embodiment of a semiconductor device according to the present invention illustrating when it is mounted onto a printed circuit board.

Now, a sixth embodiment of the present invention will be described with reference to FIG. 13. This embodiment, as shown in FIG. 13, is a semiconductor device in which projecting leads 14, similar to those of the fifth embodiment, are provided on the outer periphery of the metal plates 6 of the fourth embodiment. The arrangement other than the above is the same as in the fourth embodiment.

According to the sixth embodiment, the semiconductor element 1 is connected to the projecting lead connecting sections 15b of the printed circuit board 15 through the metal plate 6, and therefore the heat dissipation effect is further enhanced in comparison with the 15 fifth embodiment.

In the six embodiments described above, examples in which two semiconductor elements are loaded on one lead frame are shown for simplicity but it is of course possible to increase the number of semiconductor elements to be loaded. It is a matter of course that the larger number of semiconductor elements provide higher productivity. In addition, it is also efficient when the semiconductor elements are mounted on the lead frame in a matrix of multiple rows and columns.

According to the present invention, a plurality of arrangements of semiconductor devices are formed on one lead frame, and then they are cut and separated. Therefore, a plurality of semiconductor devices can be simultaneously produced, and productivity is significantly improved. In addition, since only a lead frame and an insulating tape which are simple in shape are first bonded, bonding can be easily performed in various manners, and adhesive can be applied in a uniform thickness, whereby the flatness of the insulating tape can be improved to enhance the connection reliability of the solder bump.

What is claimed is:

1. The semiconductor device comprising a semiconductor element, an insulating tape on a surface of which a number of wiring patterns and a number of electrode pads are formed, and a metal plate bonded to a reverse surface of said insulating tape by adhesive, said wiring patterns being electrically connected to electrodes of said semiconductor element, a number of solder bumps being connected to said electrode pads, at least a circuit formed surface of said semiconductor element being coated with a sealing resin, wherein at least one side wall of said device is formed as a cut surface which cuts through said insulating tape, said adhesive and said metal plate, wherein said metal plate comprises an element mount for mounting said semiconductor element, and an insulating tape mount positioned around said element mount and for mounting said insulating tape, wherein a top surface of said element mount is positioned at a position lower than a surface of said insulating tape mount, said element mount and said insulating tape mount being connected by connecting steps starting from an outside of a boundary between said element mount and said insulating tape mount and extending to an outer periphery of said element mount, wherein at least a part of an outer periphery of said metal plate extends beyond an outer periphery of said insulating tape.

2. The semiconductor device as set forth in claim 1, wherein projecting leads integral with said metal plate projecting to the height of the solder bump are provided on said at least part of said metal plate extending beyond the outer periphery of said insulating tape.

3. The semiconductor device as set forth in claim 1, wherein said wiring patterns and the electrodes of said semiconductor element are electrically connected by metal wires.

4. The semiconductor device as set forth in claim 3, wherein said wiring patterns and the electrodes of said semiconductor element are electrically connected by metal wires.

5. The semiconductor device as set forth in claim 2, wherein said wiring patterns and the electrodes of said semiconductor element are electrically connected by metal wires.

* * * * *